(12) United States Patent
Yamashita

(10) Patent No.: US 11,271,542 B2
(45) Date of Patent: Mar. 8, 2022

(54) ACOUSTIC WAVE DEVICE AND METHOD OF FABRICATING THE SAME

(71) Applicant: TAIYO YUDEN CO., LTD., Tokyo (JP)

(72) Inventor: Takashi Yamashita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 901 days.

(21) Appl. No.: 15/686,621

(22) Filed: Aug. 25, 2017

(65) Prior Publication Data
US 2018/0069526 A1     Mar. 8, 2018

(30) Foreign Application Priority Data

Sep. 6, 2016   (JP) .............................. JP2016-174064

(51) Int. Cl.
*H01L 41/313*     (2013.01)
*H03H 9/25*       (2006.01)
(Continued)

(52) U.S. Cl.
CPC ......... *H03H 9/059* (2013.01); *H01L 41/0533* (2013.01); *H01L 41/1873* (2013.01);
(Continued)

(58) Field of Classification Search
CPC ........ H03H 9/25; H03H 9/059; H03H 9/6483; H01L 41/0533; H01L 41/1873;
(Continued)

(56) References Cited

U.S. PATENT DOCUMENTS 9,197,190 B2 * 11/2015 Yamashita ............... H03H 9/25
9,407,235 B2 *  8/2016 Yamashita ............ H03H 9/059
(Continued)

FOREIGN PATENT DOCUMENTS

JP        10-79638 A      3/1998
JP      2004-304622    * 10/2004   ............... H03H 9/25
(Continued)

OTHER PUBLICATIONS

Japanese Office Action dated Mar. 5, 2019, in a counterpart Japanese patent application No. 2016-174064. (A machine translation (not reviewed for accuracy) attached.).

*Primary Examiner* — Shawki S Ismail
*Assistant Examiner* — Karen B Addison
(74) *Attorney, Agent, or Firm* — Chen Yoshimura LLP

(57) ABSTRACT

An acoustic wave device includes: a mounting substrate; a first wiring layer located on an upper surface of the mounting substrate, the first wiring layer including a first bond region and a first connection region connecting with the first bond region and having a thickness substantially equal to a thickness of the first bond region; an element substrate mounted on the mounting substrate; an acoustic wave element located on a lower surface of the element substrate; and a second wiring layer located on the lower surface of the element substrate, the second wiring layer including a second bond region and a second connection region, the second bond region directly bonding with the first bond region of the first wiring layer, the second connection region connecting the acoustic wave element with the second bond region and having a thickness substantially equal to a thickness of the second bond region.

10 Claims, 17 Drawing Sheets

(51) Int. Cl.
*H01L 41/047* (2006.01)
*H03H 9/05* (2006.01)
*H01L 41/053* (2006.01)
*H01L 41/187* (2006.01)
*H03H 3/08* (2006.01)
*H03H 9/64* (2006.01)

(52) U.S. Cl.
CPC .............. *H01L 41/313* (2013.01); *H03H 3/08* (2013.01); *H03H 9/25* (2013.01); *H01L 41/047* (2013.01); *H01L 2224/16225* (2013.01); *H01L 2924/15174* (2013.01); *H03H 9/6483* (2013.01)

(58) Field of Classification Search
CPC ......... H01L 41/047; H01L 2224/16225; H01L 2924/15174; H01L 41/313; H01L 3/08
See application file for complete search history.

(56) References Cited

U.S. PATENT DOCUMENTS

2004/0207485 A1   10/2004  Kawachi et al.
2010/0066209 A1*   3/2010  Saitou ................... H03H 9/059
                                              310/340

FOREIGN PATENT DOCUMENTS

| JP | 2004-304622 A | 10/2004 | | |
| JP | 2005-26630 A | 1/2005 | | |
| JP | 2006-319211 A | 11/2006 | | |
| JP | 2010-74418 A | 4/2010 | | |
| JP | 2013-121711 | * | 7/2013 | ............... H03H 9/25 |
| JP | 2013-131711 | * | 7/2013 | ............... H03H 9/25 |
| JP | 2013-131711 A | 7/2013 | | |

* cited by examiner

FIG. 15A

| Px1[μm] | Py1[μm] | Pz1[μm] | Px4[μm] | Py4[μm] | Pz2[μm] | Cx1[μm] | Cy1[μm] | Cz1[μm] | Cz2[μm] |
|---|---|---|---|---|---|---|---|---|---|
| 1800 | 1400 | 140 | 150 | 150 | 10 | 700 | 1100 | 150 | 10 |

FIG. 15B

| SAMPLE | Px2[μm] | Py2[μm] | Px3[μm] | Py3[μm] | Cx2[μm] | Cy2[μm] | Cx3[μm] | Cy3[μm] |
|---|---|---|---|---|---|---|---|---|
| A | 40 | 80 | 60 | 40 | 80 | 40 | 40 | 60 |
| B | 50 | 72 | 60 | 40 | 90 | 32 | 40 | 60 |
| C | 32 | 90 | 60 | 40 | 72 | 50 | 40 | 60 |
| D | 80 | 40 | 40 | 60 | 40 | 80 | 60 | 40 |
| E | 90 | 32 | 40 | 60 | 50 | 72 | 60 | 40 |
| F | 72 | 50 | 40 | 60 | 32 | 90 | 60 | 40 |

| SAMPLE | BOND REGION | ELEMENT SUBSTRATE 20 | MOUNTING SUBSTRATE 10 |
|---|---|---|---|
| A | 1.00 | 0.45 | 0.61 |
| B | 0.96 | 0.46 | 0.57 |
| C | 1.06 | 0.44 | 0.64 |

| SAMPLE | BOND REGION | ELEMENT SUBSTRATE 20 | MOUNTING SUBSTRATE 10 |
|---|---|---|---|
| D | 0.94 | 0.59 | 0.49 |
| E | 0.87 | 0.58 | 0.49 |
| F | 1.03 | 0.61 | 0.47 |

ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2016-174064, filed on Sep. 6, 2016, the entire contents of which are incorporated herein by reference.

FIELD

A certain aspect of the present invention relates to an acoustic wave device and a method of fabricating the same.

BACKGROUND

As a method of packaging an acoustic wave device, there has been known a method that face-down mounts an element substrate on a mounting substrate with use of a bump as disclosed in, for example, Japanese Patent Application Publication Nos. 10-79638 and 2010-74418.

When a bump is made to be small to reduce the size and/or height of the acoustic wave device, the bondability of the bump is sacrificed. Thus, reducing the size and/or height of the acoustic wave device is difficult.

SUMMARY OF THE INVENTION

According to a first aspect of the present invention, there is provided an acoustic wave device including: a mounting substrate; a first wiring layer located on an upper surface of the mounting substrate, the first wiring layer including a first bond region and a first connection region, the first connection region connecting with the first bond region and having a thickness substantially equal to a thickness of the first bond region; an element substrate mounted on the mounting substrate; an acoustic wave element located on a lower surface of the element substrate; and a second wiring layer located on the lower surface of the element substrate, the second wiring layer including a second bond region and a second connection region, the second bond region directly bonding with the first bond region of the first wiring layer, the second connection region connecting the acoustic wave element with the second bond region and having a thickness substantially equal to a thickness of the second bond region.

According to a second aspect of the present invention, there is provided a method of fabricating an acoustic wave device, the method including: mounting an element substrate, which includes an acoustic wave element and a second wiring layer including a second bond region and a second connection region on a lower surface of the element substrate, on a mounting substrate, which includes a first wiring layer including a first bond region and a first connection region on an upper surface of the mounting substrate, so that the first bond region directly bonds with the second bond region, the second connection region connecting the acoustic wave element with the second bond region and having a thickness substantially equal to a thickness of the second bond region, the first connection region connecting with the first bond region and having a thickness substantially equal to a thickness of the first bond region.

BRIEF DESCRIPTION OF THE DRAWINGS

FIG. 15A and FIG. 15B present dimensions used for the simulation;

DETAILED DESCRIPTION

Hereinafter, a description will be given of embodiments of the present invention with reference to the accompanying drawings.

First Embodiment

Figure 1:
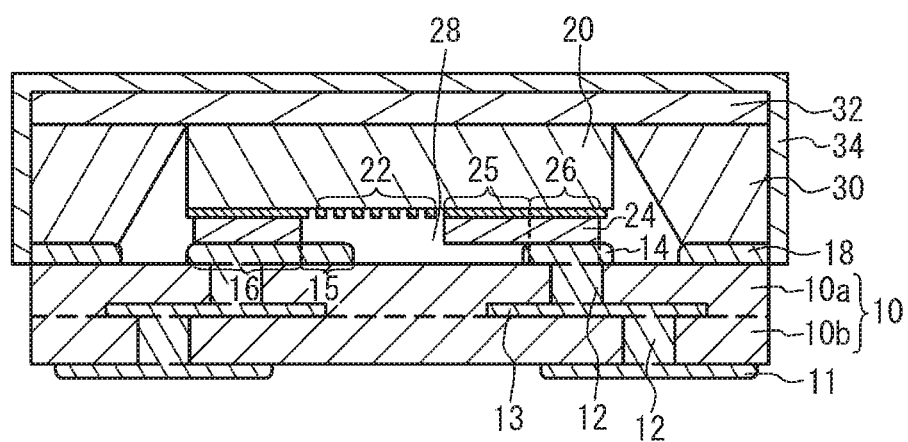
FIG. 1 is a cross-sectional view of an acoustic wave device in accordance with a first embodiment.

FIG. 1 is a cross-sectional view of an acoustic wave device in accordance with a first embodiment. As illustrated in FIG. 1, an element substrate 20 is face-down mounted on a mounting substrate 10. A sealing member 30 is located on the mounting substrate 10 so as to surround the element substrate 20. A wiring layer 14 located on the upper surface of the mounting substrate 10 is directly bonded with a wiring layer 24 located on the lower surface of the element substrate 20.

The mounting substrate 10 includes a plurality of insulating layers 10a and 10b. The mounting substrate 10 may not be necessarily a multilayered substrate, and may be a single-layer substrate. Terminals 11 are located on the lower surface of the mounting substrate 10. The terminal 11 is a terminal that connects an acoustic wave element 22 with an external circuit, and is, for example, a foot pad. Via wirings 12 are formed so as to penetrate through the insulating layers 10a and 10b. Internal wiring lines 13 are located between the insulating layers 10a and 10b. The wiring layer 14 and a ring-shaped electrode 18 are located on the upper surface of the mounting substrate 10. The ring-shaped electrode 18 is located in the periphery of the substrate 10. The via wirings 12 and the internal wiring lines 13 electrically connect the terminal 11 with the wiring layer 14. The insulating layers 10a and 10b are, for example, resin layers or ceramic layers. The terminals 11, the via wirings 12, the internal wiring lines 13, the wiring layer 14, and the ring-shaped electrode 18 are formed of a metal layer such as, for example, a copper layer, a gold layer, or an aluminum layer.

The acoustic wave element 22 and the wiring layer 24 are located on the lower surface of the element substrate 20. The wiring layers 14 and 24 are bonded together. The wiring layer 24 is formed of a metal layer such as, for example, a copper layer, a gold layer, or an aluminum layer. To bond the wiring layers 14 and 24 together, the upper surface of the wiring layer 14 and the lower surface of the wiring layer 24 are preferably made of the same material. The region bonding with the wiring layer 14 of the wiring layer 24 is a bond region 26. The region connecting the acoustic wave element 22 with the bond region 26 is a connection region 25.

The sealing member 30 is located on the mounting substrate 10 so as to surround the element substrate 20. The sealing member 30 is made of, for example, a metal material such as solder or an insulating material such as resin. The sealing member 30 is bonded with the ring-shaped electrode 18. A plate-like lid 32 is located on the upper surface of the element substrate 20 and the upper surface of the sealing member 30. The lid 32 is, for example, a metal plate or an insulating plate. A protective film 34 is located so as to cover the lid 32 and the sealing member 30. The protective film 34 is a metal film or an insulating film. The acoustic wave element 22 faces the upper surface of the substrate 10 across an air gap 28. The air gap 28 is sealed by the sealing member 30, the mounting substrate 10, the element substrate 20, and the lid 32.

Figure 2:
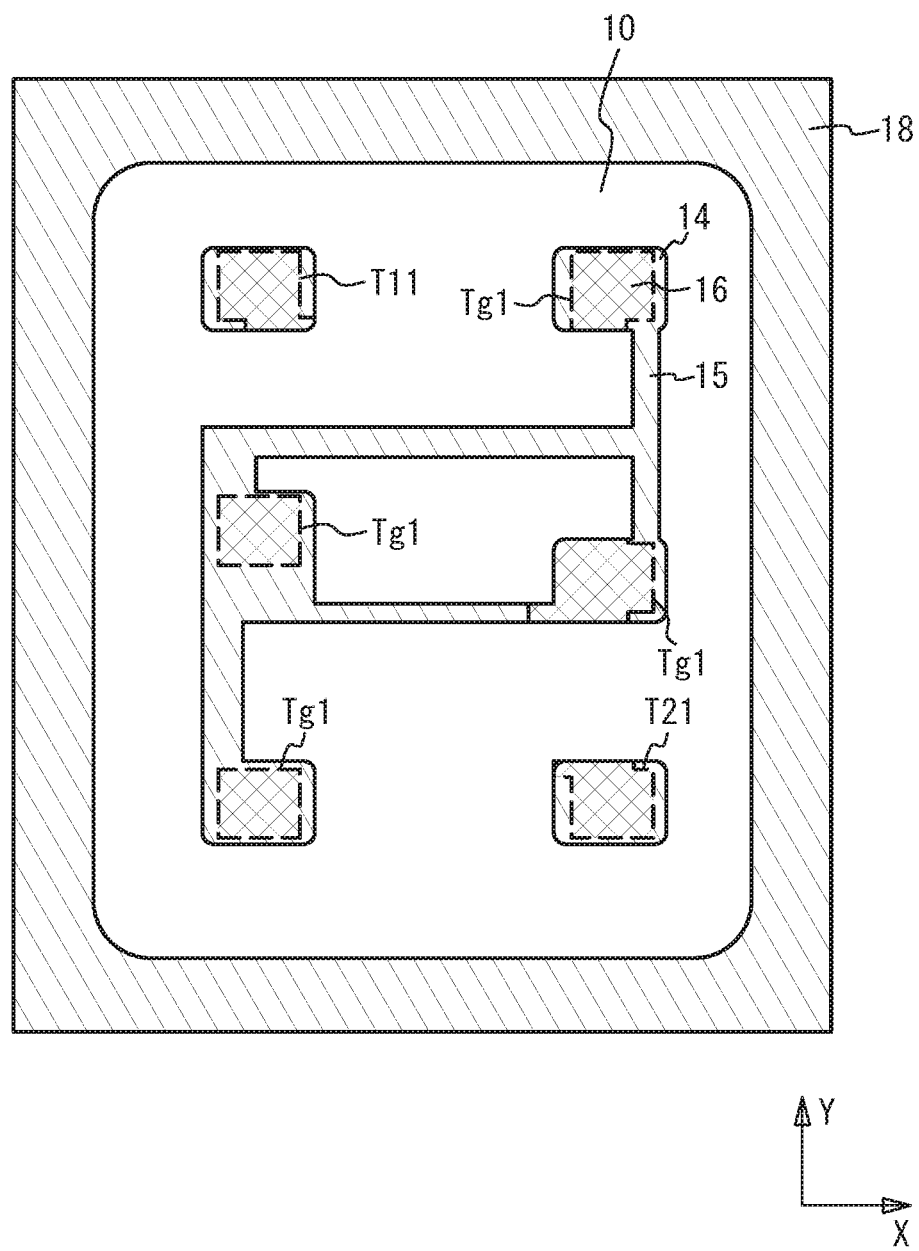
FIG. 2 is a plan view of the upper surface of a mounting substrate in the first embodiment.

FIG. 2 is a plan view of the upper surface of the mounting substrate in the first embodiment. As illustrated in FIG. 2, the wiring layers 14 are located on the upper surface of the mounting substrate 10. The wiring layers 14 have bond regions 16 and a connection region 15 connected with the bond regions 16. The connection region 15 connects a plurality of the bond regions 16. The ring-shaped electrode 18 is located in the periphery of the mounting substrate 10 so as to surround the wiring layers 14. The bond regions 16 and the connection region 15 are formed, for example, at the same time, and the film thickness of the wiring layer 14 in the bond regions 16 and the connection region 15 is substantially constant to the extent of the manufacturing error. The bond regions 16 include a first terminal T11, a second terminal T21, and ground terminals Tg1.

Figure 3:
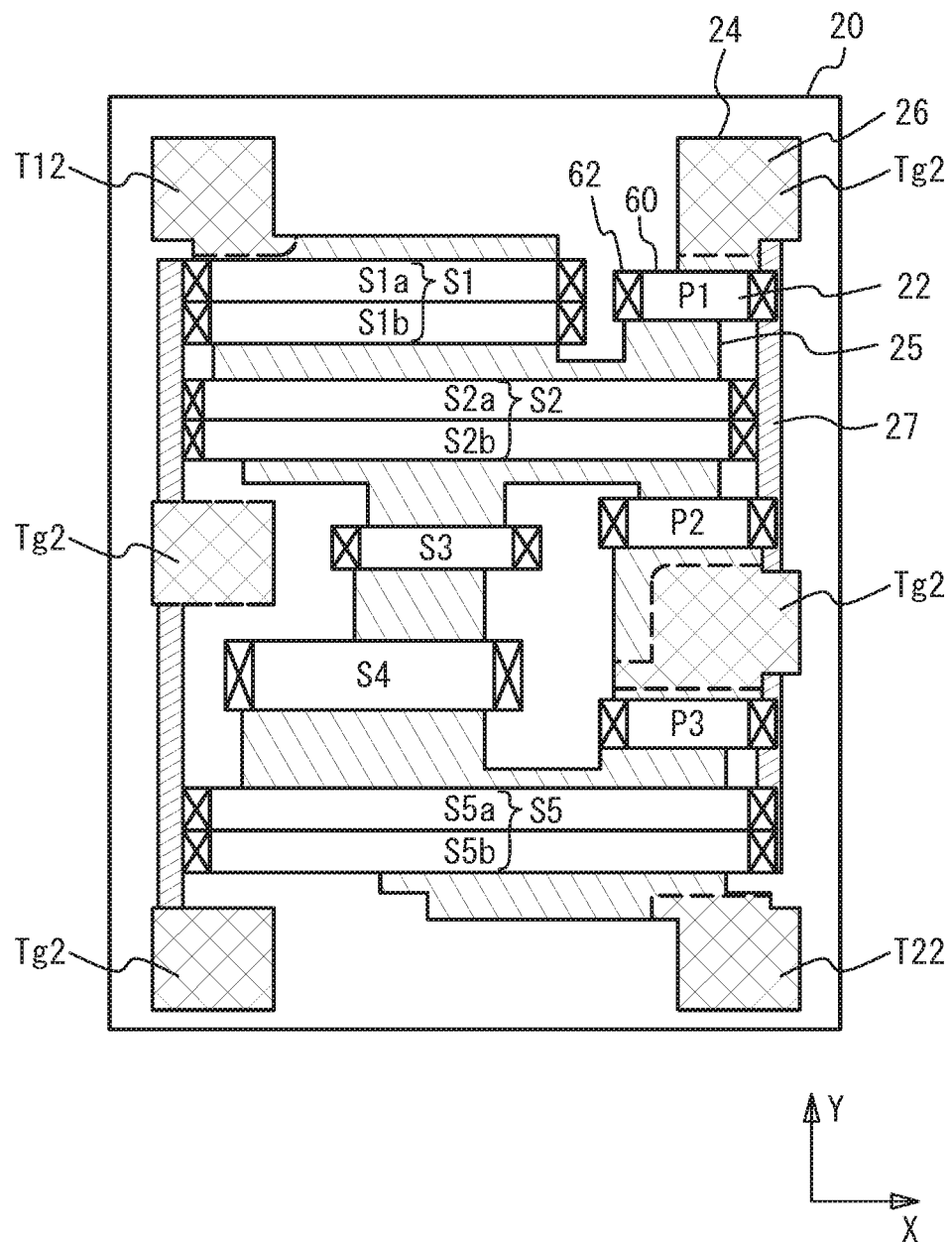
FIG. 3 is a plan view of a lower surface of an element substrate in the first embodiment.

FIG. 3 is a plan view of the lower surface of the element substrate in the first embodiment. To make the correspondence with FIG. 2 understandable, FIG. 3 is a transparent plan view from above the element substrate 20. The acoustic wave elements 22, the wiring layers 24, and wiring layers 27 are located on the lower surface of the element substrate 20. The acoustic wave element 22 is, for example, a surface acoustic wave element, and includes an interdigital transducer (IDT) 60 and reflectors 62. The wiring layers 24 include the bond regions 26 and the connection regions 25. The bond region 26 is a region that directly bonds with the bond region 16 of the wiring layer 14. The connection regions 25 connect the bond region 26 with the acoustic wave element 22, and/or interconnect a plurality of the acoustic wave elements 22. The bond regions 26 and the connection regions 25 are formed, for example, at the same time, and the film thickness of the wiring layer 24 in the bond regions 26 and the connection regions 25 is substantially constant to the extent of the manufacturing error. The wiring layers 27 connect the bond region 26 with the acoustic wave element 22, or interconnects the acoustic wave elements 22. In FIG. 3, the wiring layers 27 connect the reflectors 62 with ground terminals Tg2. The bond regions 26 include a first terminal T12, a second terminal T22, and the ground terminals Tg2.

A plurality of series resonators Si through S5 are connected in series through the connection regions 25 between the first terminal T12 and the second terminal T22. The series resonators S1, S2, and S5 are respectively serially divided into resonators S1a and S1b, S2a and S2b, and S5a and S5b. A plurality of parallel resonators P1 through P3 are connected in parallel through the connection regions 25 between the first terminal T12 and the second terminal T22. First ends of the parallel resonators P1 through P3 are coupled to the ground terminals Tg2 through the connection regions 25. The series resonators S1 through S5 and the parallel resonators P1 through P3 form a ladder-type filter.

Figure 4:
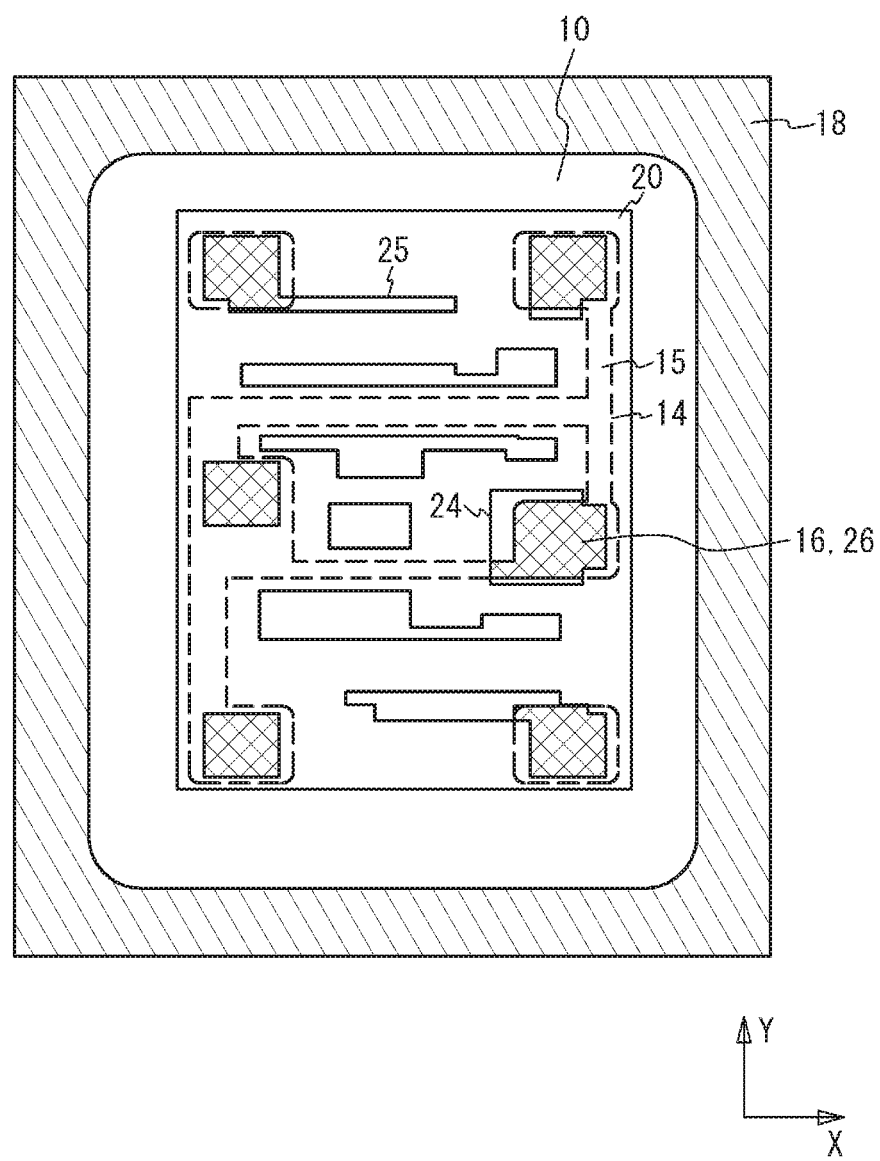
FIG. 4 is a plan view illustrating the upper surface of the mounting substrate and the lower surface of the element substrate in the first embodiment.
Figure 5:
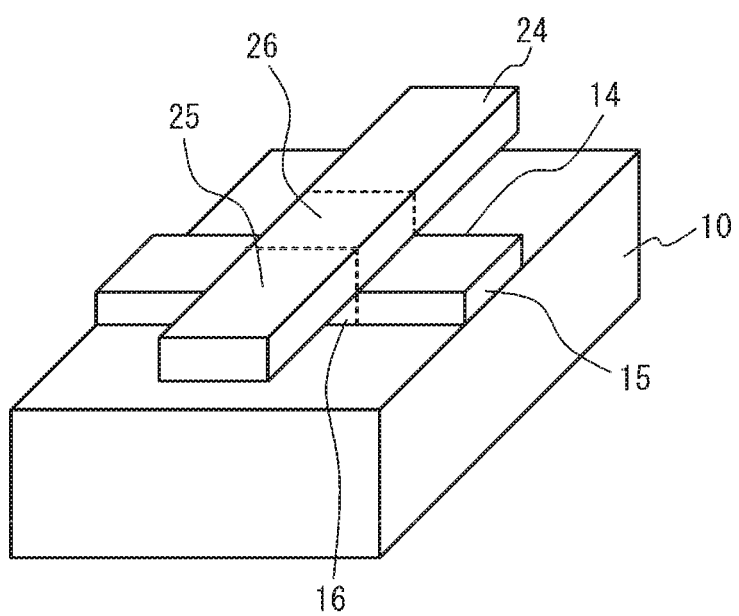
FIG. 5 is a perspective view of metal layers in the first embodiment.

FIG. 4 is a plan view illustrating the upper surface of the mounting substrate and the lower surface of the element substrate in the first embodiment. In FIG. 4, the wiring layers 14 are indicated by dashed lines, and the wiring layers 24 are indicated by solid lines. FIG. 5 is a perspective view of metal layers in the first embodiment. FIG. 5 illustrates the vicinity of the region in which the wiring layers 14 and 24 intersect with each other. As illustrated in FIG. 4 and FIG. 5, the bond regions 16 and 26 are bonded together, and have the same planar shape. The regions other than the bond regions 16 and 26 of the wiring layers 14 and 24 are the connection regions 15 and 25.

Figure 6A:
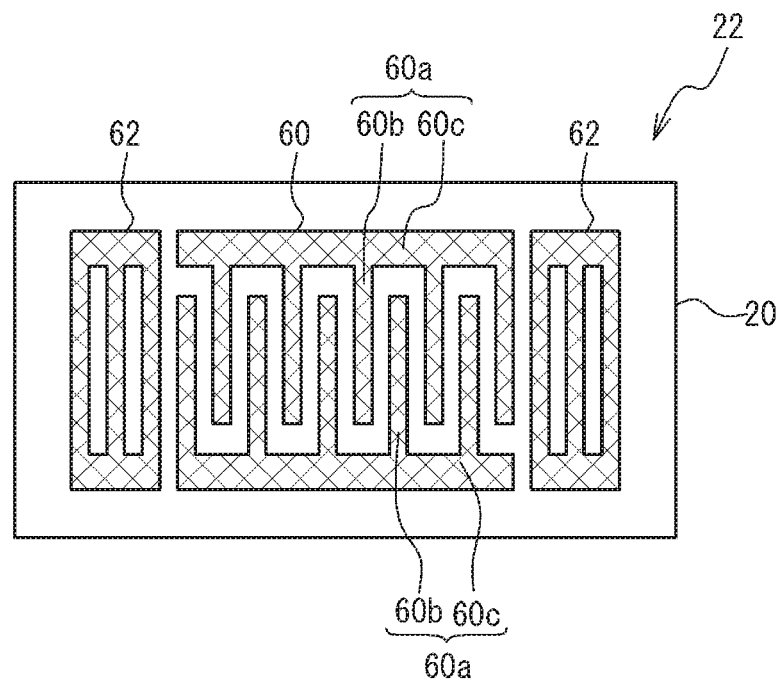
FIG. 6A and FIG. 6B illustrate exemplary acoustic wave elements in the first embodiment.
Figure 6B:
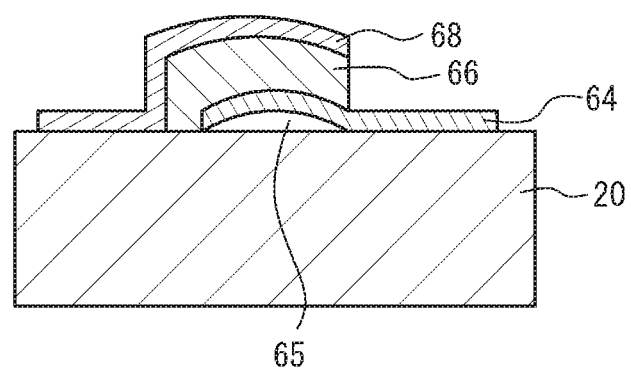

FIG. 6A and FIG. 6B illustrate exemplary acoustic wave elements in the first embodiment. FIG. 6A is a plan view of a surface acoustic wave resonator, and FIG. 6B is a cross-sectional view of a piezoelectric thin film resonator. As illustrated in FIG. 6A, a surface acoustic wave resonator is located on the element substrate 20 as the acoustic wave element 22. The acoustic wave element 22 includes the IDT 60 and the reflectors 62. The IDT 60 includes a pair of comb-shaped electrodes 60a facing each other. The comb-shaped electrode 60a includes a plurality of electrode fingers 60b and a bus bar 60c to which the electrode fingers 60b are connected. The reflectors 62 are located at both sides of the IDT 60. The IDT 60 excites a surface acoustic wave on the element substrate 20. The element substrate 20 is, for example, a piezoelectric substrate such as a lithium tantalate substrate or a lithium niobate substrate. The piezoelectric substrate may be bonded on a support substrate such as a sapphire substrate, a spinel substrate, an alumina substrate, or a silicon substrate. The IDT 60 and the reflectors 62 are formed of a metal layer such as a copper layer or a gold layer. A protective film or a temperature compensation film may be located so as to cover the IDT 60 and the reflectors 62.

As illustrated in FIG. 6B, a piezoelectric thin film resonator is formed on the element substrate 20 as the acoustic wave element 22. A piezoelectric film 66 is formed on the element substrate 20. A lower electrode 64 and an upper electrode 68 are located so as to sandwich the piezoelectric film 66. An air gap 65 is formed between the lower electrode 64 and the element substrate 20. Instead of the air gap 65, an acoustic mirror reflecting the acoustic wave in the piezoelectric film may be located. The lower electrode 64 and the upper electrode 68 excite the acoustic wave in the thickness extension mode inside the piezoelectric film 66. The lower electrode 64 and the upper electrode 68 are formed of a metal film such as, for example, a ruthenium film. The piezoelectric film 66 is, for example, an aluminum nitride film. As illustrated in FIG. 6A and FIG. 6B, the acoustic wave element 22 includes an electrode that excites an acoustic wave. Thus, the acoustic wave element 22 is covered with the air gap 28 to prevent the restriction of the acoustic wave.

Figure 7A:
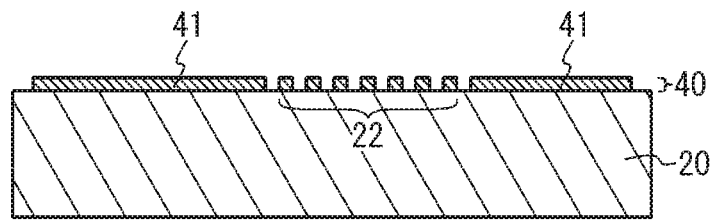
FIG. 7A through FIG. 7C are cross-sectional views (No. 1) illustrating a method of fabricating the acoustic wave device in accordance with the first embodiment.
Figure 7B:
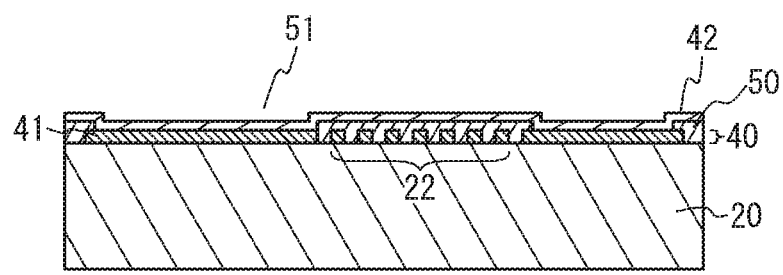
Figure 7C:
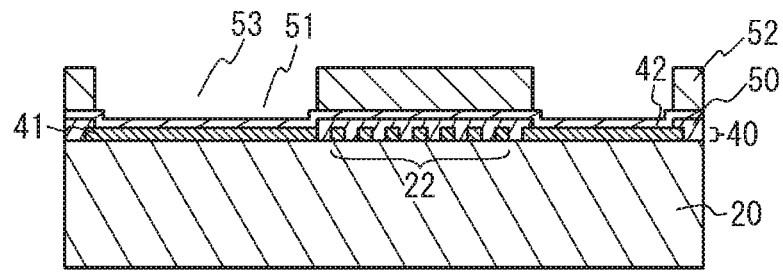

FIG. 7A through FIG. 9B are cross-sectional views illustrating a method of fabricating the acoustic wave device in accordance with the first embodiment. As illustrated in FIG. 7A, a metal film 40 is formed on the element substrate 20. The metal film 40 forms the acoustic wave element 22 and undercoat layers 41. The metal film 40 is, for example, a copper film or an aluminum film. As illustrated in FIG. 7B, a mask layer 50 having apertures 51 is formed on the element substrate 20. The mask layer 50 is made of, for example, photoresist. The aperture 51 is formed in the region in which the wiring layer 24 is to be formed. A seed layer 42 is formed in the apertures 51 and on the mask layer 50. The seed layer 42 is, for example, a metal layer such as a gold layer. An adhesion layer may be formed between the seed layer 42 and the undercoat layer 41. As illustrated in FIG. 7C, a mask layer 52 having apertures 53 is formed on the seed layer 42. The mask layer 52 is made of, for example, photoresist. The aperture 53 overlaps with the aperture 51.

Figure 8A:
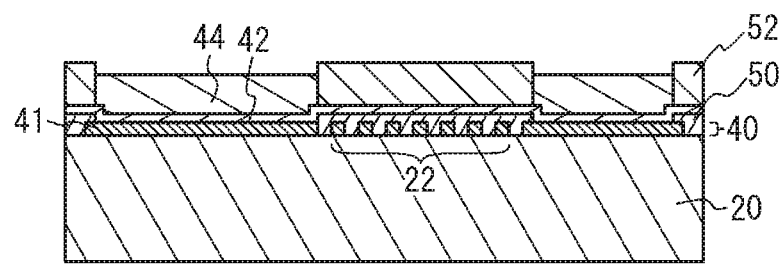
FIG. 8A through FIG. 8C are cross-sectional views (No. 2) illustrating the method of fabricating the acoustic wave device in accordance with the first embodiment.
Figure 8B:
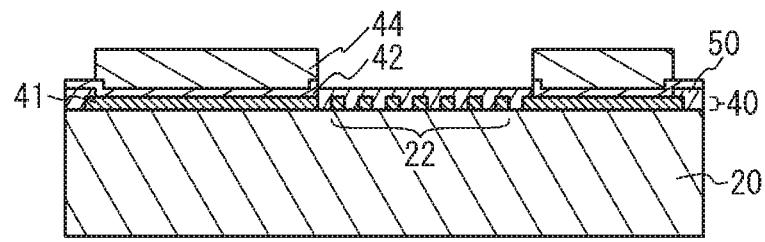
Figure 8C:
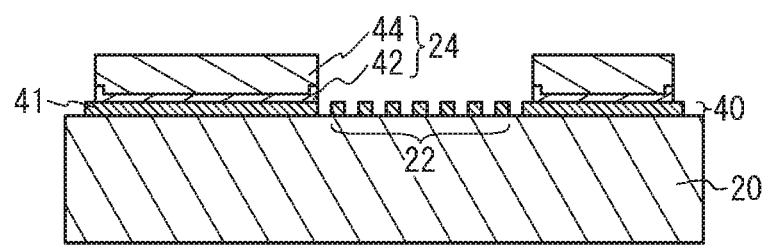

As illustrated in FIG. 8A, a plated layer 44 is formed in the apertures 51 and 53 by supplying electric current to the seed layer 42. The plated layer 44 is, for example, a gold layer with a film thickness of 10 μm. As illustrated in FIG. 8B, the mask layer 52 is peeled. The seed layer 42 is removed using the plated layer 44 as a mask. As illustrated in FIG. 8C, the mask layer 50 is peeled. This process forms the wiring layer 24 made of the seed layer 42 and the plated layer 44. The wiring layer 24 is a copper layer or a nickel layer. Alternatively, the wiring layer 24 may be a composite layer having a plurality of metal layers made of different materials. The film thickness of the wiring layer 24 is, for example, 1 to 10 μm. Then, the element substrate 20 is separated into individual chips.

Figure 9A:
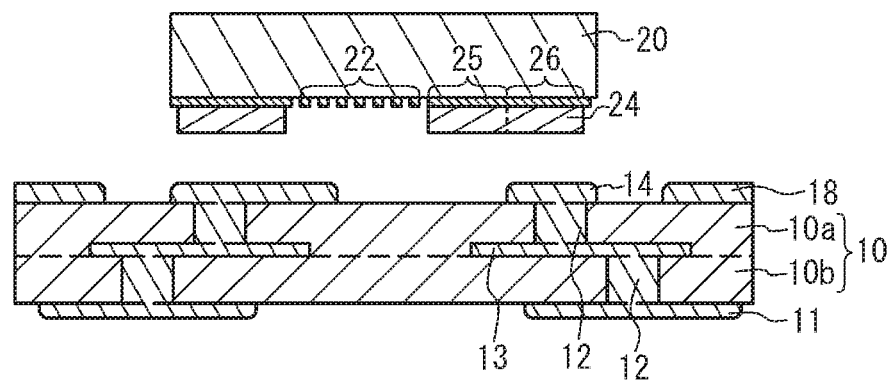
FIG. 9A and FIG. 9B are cross-sectional views (No. 3) illustrating the method of fabricating the acoustic wave device in accordance with the first embodiment.
Figure 9B:
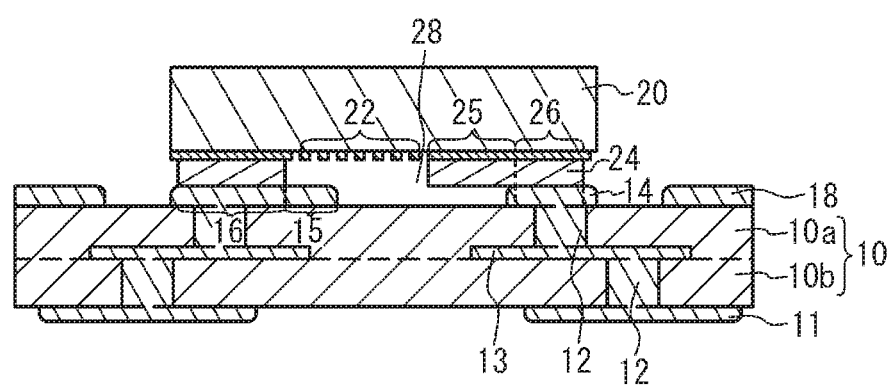

As illustrated in FIG. 9A, the separated element substrate 20 is arranged above the mounting substrate 10 so that the acoustic wave element 22 and the wiring layers 24 face downward. The wiring layer 24 is a gold layer with a film thickness of 10 μm. As illustrated in FIG. 9B, the element substrate 20 is heated to, for example, 300° C. The element substrate 20 is pressed against the mounting substrate 10 so that the wiring layers 14 and 24 are bonded together. The pressing load is for example, 0.03 gf/μm$^2$ per unit area of the bond regions 16 and 26. Through this process, the element substrate 20 is mounted on the mounting substrate 10.

Then, as illustrated in FIG. 1, a sealing plate made of solder such as AgSu or resin is arranged on the element substrate 20. The lid 32 is arranged on the sealing plate. The lid 32 is pressed against the element substrate 20 at a temperature equal to or greater than the melting point of the sealing plate. The sealing member 30 made from the melted sealing plate is formed so as to surround the element substrate 20. Since the wettability between the sealing member 30 and the ring-shaped electrode 18 is good, the sealing member 30 is bonded with the ring-shaped electrode 18. The lid 32, the sealing member 30, and the mounting substrate 10 are cut. The protective film 34 is formed so as to cover the sealing member 30 and the lid 32 by, for example, barrel electrolytic plating.

Figure 10A:
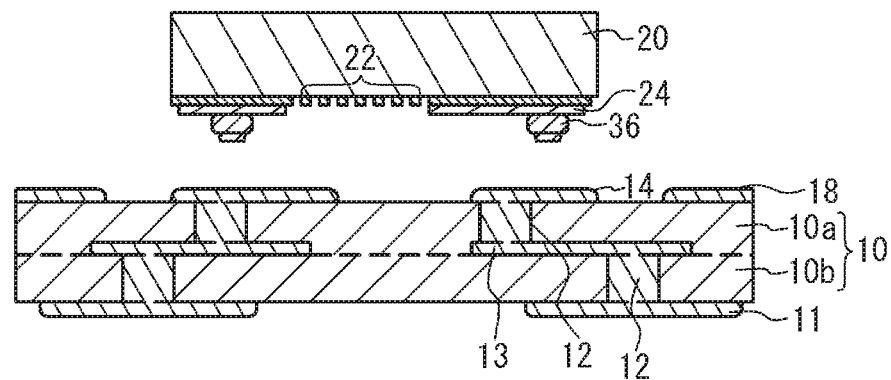
FIG. 10A and FIG. 10B are cross-sectional views illustrating a method of fabricating an acoustic wave device in accordance with a first comparative example.
Figure 10B:
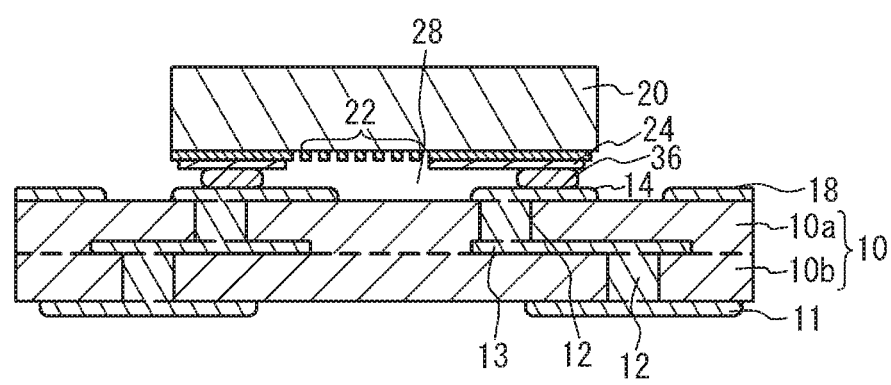

The advantage of the first embodiment will be described by comparison with a comparative example. FIG. 10A and FIG. 10B are cross-sectional views illustrating a method of fabricating an acoustic wave device in accordance with a first comparative example. As illustrated in FIG. 10A, the wiring layers 14 and 24 are thinner than those of the first embodiment. Bumps 36 are located in the bond regions 26 of the wiring layers 24. The bumps 36 are, for example, gold bumps. As illustrated in FIG. 10B, the bumps 36 are bonded with the wiring layers 14. Other structures are the same as those of the first embodiment, and the description thereof is thus omitted.

In the first comparative example, when the bumps 36 are made to be small to reduce the size of the acoustic wave device, the bondability between the bump 36 and the wiring layer 14 deteriorates. Thus, the bump 36 is not able to be made to be small. In addition, considering the manufacture margin necessary for the bumps 36 to be formed under the wiring layers 24, the chip size of the element substrate 20 increases.

In the first embodiment, the wiring layer 14 (a first wiring layer), which has the bond region 16 (a first bond region) and the connection region 15 (a first connection region) having approximately the same thickness, is located on the upper surface of the mounting substrate 10. The wiring layer 24 (a second wiring layer), which has the bond region 26 (a second bond region) and the connection region 25 (a second connection region) having approximately the same thickness, is located on the lower surface of the element substrate 20. As illustrated in FIG. 9B, the bond regions 26 and 16 are directly bonded together. This structure makes the bond regions 26 and 16 be in direct contact with each other as illustrated in FIG. 1. Therefore, the margin for the wiring layer 24 and the bump 36 becomes unnecessary, and the size of the acoustic wave device is reduced.

To directly bond the wiring layers 14 and 24 together, respective parts being in contact with the bond surface of the wiring layers 14 and 24 are preferably mainly composed of copper or gold.

As illustrated in FIG. 2, among a plurality of parts at which the bond regions 26 and 16 are in contact with each other, the area of a bond between the bond regions 26 and 16 is approximately the same. For example, the area of each bond is preferably an area within a 20% range of the average of the areas of the bonds. This configuration makes the bond strengths in the bond regions 26 and 16 approximately the same.

As illustrated in FIG. 2 through FIG. 4, the wiring layer 27 (a third wiring layer) connects between the acoustic wave elements 22, and is not in contact with the wiring layer 14 in the region in which the wiring layer 27 overlaps with the wiring layer 14 in plan view. This structure allows the wiring layer 27 to electrically connect between the acoustic wave elements 22 without being in contact with the mounting substrate 10.

Second Embodiment

Figure 11:
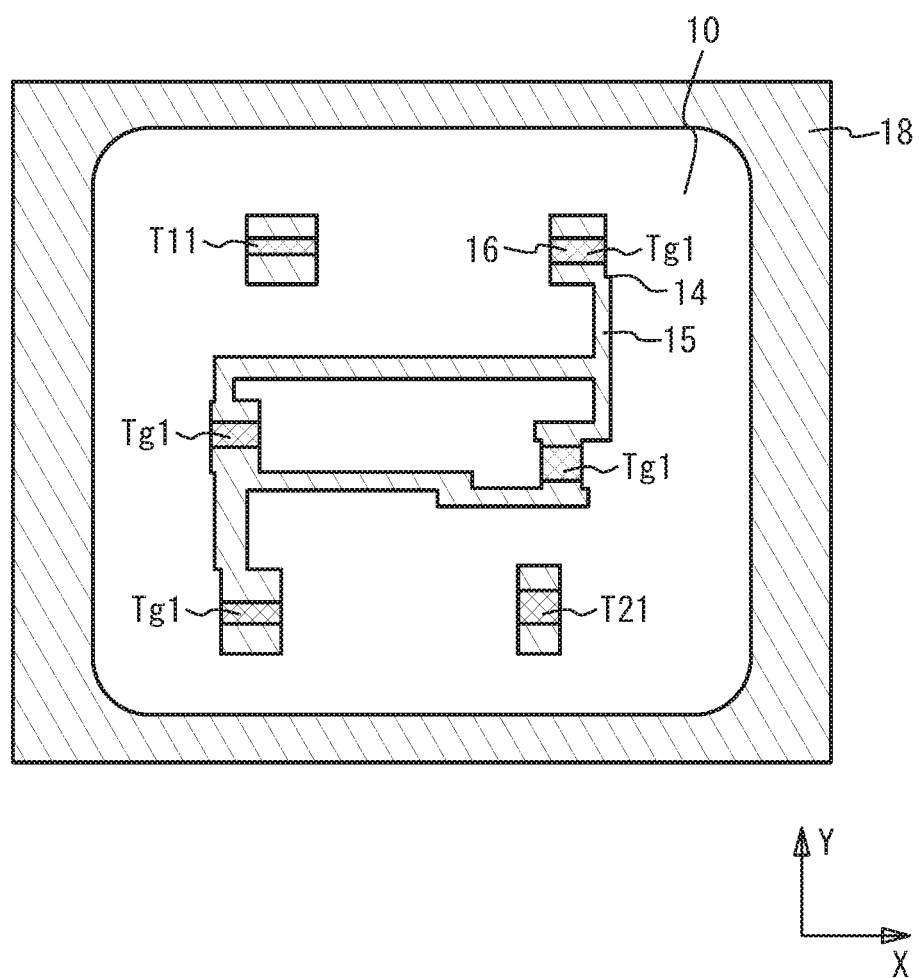
FIG. 11 is a plan view of the upper surface of the mounting substrate in a second embodiment.
Figure 12:
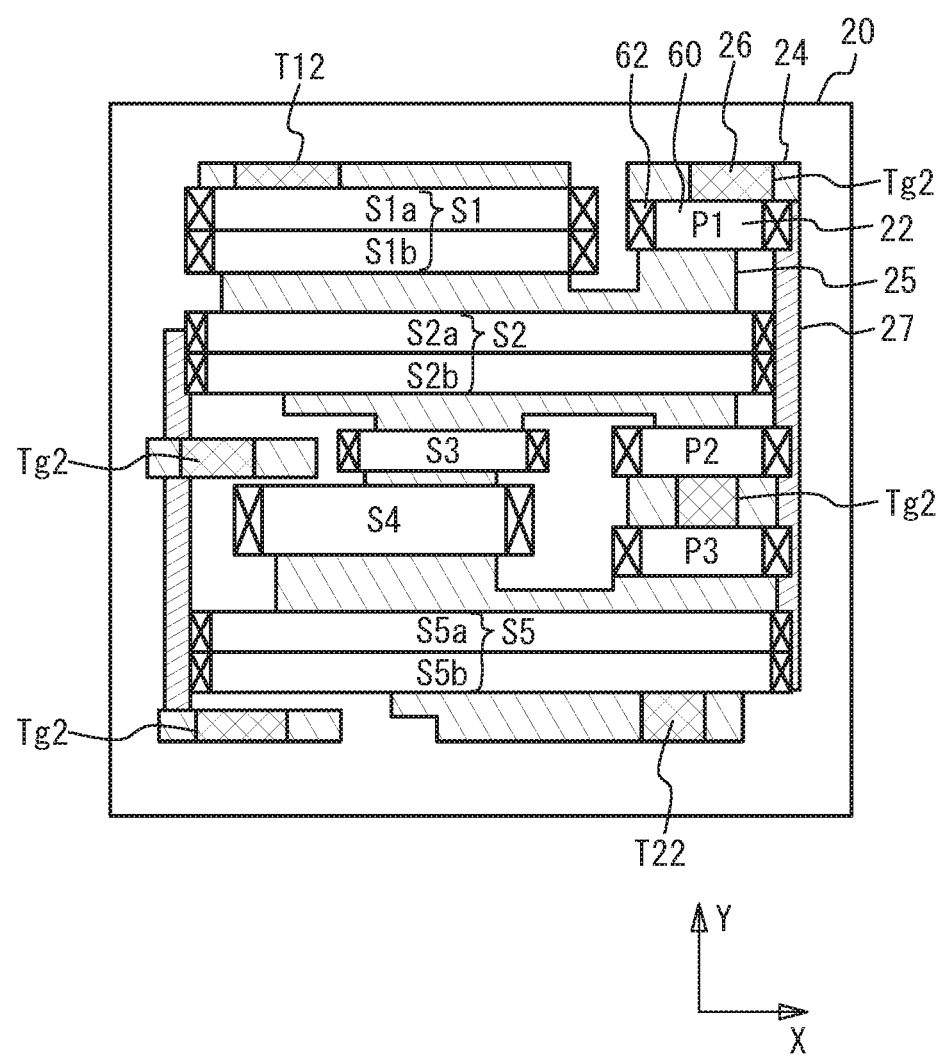
FIG. 12 is a plan view of the lower surface of the element substrate in the second embodiment.
Figure 13:
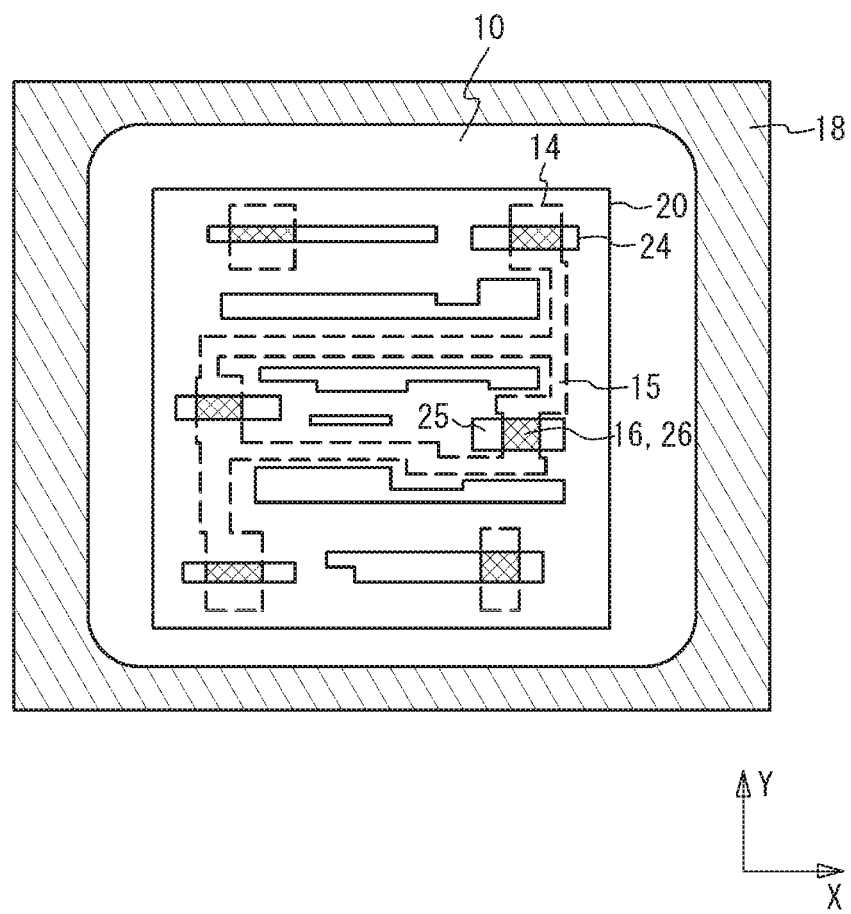
FIG. 13 is a plan view illustrating the upper surface of the mounting substrate and the lower surface of the element substrate in the second embodiment.

FIG. 11 is a plan view of the upper surface of the mounting substrate in a second embodiment, and FIG. 12 is a plan view of the lower surface of the element substrate in the second embodiment, and FIG. 13 is a plan view illustrating the upper surface of the mounting substrate and the lower surface of the element substrate in the second embodiment. The propagation direction of the acoustic wave in the element substrate 20 is defined as an X direction, and the direction perpendicular to the X direction in the plane is defined as a Y direction. The X direction and the Y direction do not necessarily correspond to the crystal orientation of the element substrate 20. When the element substrate 20 is a Y-cut X-propagation substrate, the X direction corresponds to the X-axis orientation of the crystal orientation. As illustrated in FIG. 11 through FIG. 13, the planar shapes of the bond regions 26 and 16 are a rectangular shape having longer sides in the X direction. Other structures are the same as those of the first embodiment, and the description thereof is thus omitted.

In the second embodiment, the wiring layer 24 extending in the X direction intersects with the wiring layer 14 extending in the Y direction in the region where the bond regions 26 and 16 are in contact with each other. This structure reduces the area of the contact between the bond regions 26 and 16. It is only required that the extension directions of the wiring layers 24 and 14 intersect with each other.

As illustrated in FIG. 12, the bond region 26 overlaps with the bus bar of the acoustic wave element 22 in plan view. This structure reduces the area of the element substrate 20.

Third Embodiment

Figure 14A:
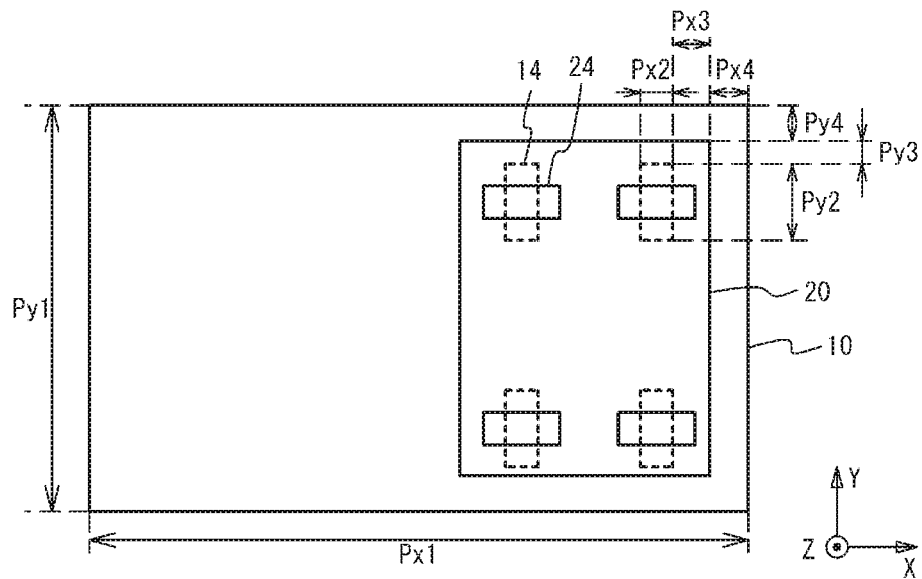
FIG. 14A is a plan view of a simulated mounting substrate.
Figure 14B:
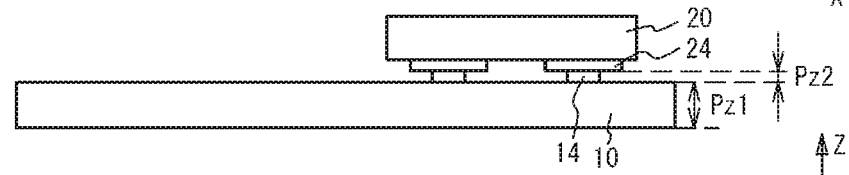
FIG. 14B is a side view of the mounting substrate.
Figure 14C:
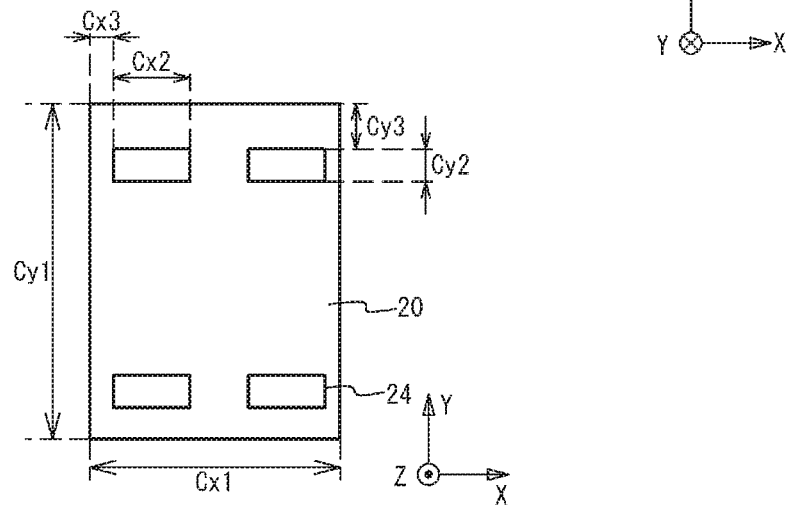
FIG. 14C is a plan view of the element substrate.
Figure 14D:
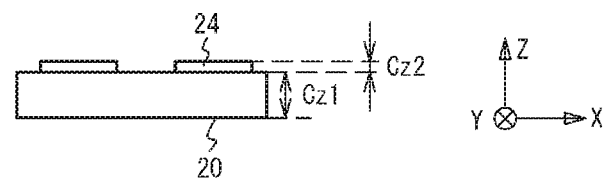
FIG. 14D is a side view of the element substrate.

The stress applied to the wiring layer 24 and 14 was simulated by changing the shapes of the bond regions 26 and 16. FIG. 14A is a plan view of a simulated mounting substrate, FIG. 14B is a side view of the mounting substrate, FIG. 14C is a plan view of the element substrate, and FIG. 14D is a side view of the element substrate. The X direction corresponds to the X-axis orientation of the crystal orientation of the element substrate 20. As illustrated in FIG. 14A through FIG. 14D, the length of the mounting substrate 10 in the X direction was defined as Px1, and the length in the Y direction was defined as Py1. The width of the wiring layer 14 in the X direction was defined as Px2, and the width in the Y direction was defined as Py2. The distance from the edge of the element substrate 20 to the edge of the wiring layer 14 in the X direction was defined as Px3, and the distance from the edge of the element substrate 20 to the edge of the wiring layer 14 in the Y direction was defined as Py3. The distance from the edge of the mounting substrate 10 to the edge of the element substrate 20 in the X direction was defined as Px4, and the distance from the edge of the mounting substrate 10 to the edge of the element substrate 20 in the Y direction was defined as Py4. The thickness of the mounting substrate 10 was defined as Pz1, and the thickness of the wiring layer 14 was defined as Pz2.

The length of the element substrate 20 in the X direction was defined as Cx1, and the length in the Y direction was defined as Cy1. The width of the wiring layer 24 in the X direction was defined as Cx2 and the width in the Y direction was defined as Cy2. The distance from the edge of the element substrate 20 to the edge of the wiring layer 24 in the X direction was defined as Cx3, and the distance from the edge of the element substrate 20 to the edge of the wiring layer 24 in the Y direction was defined as Cy3. The thickness of the element substrate 20 was defined as Cz1, and the thickness of the wiring layer 24 was defined as Cz2.

FIG. 15A and FIG. 15B present dimensions used for the simulation. As presented in FIG. 15A, Px1, Py1, Pz1, Px4, Py4, Pz2, Cx1, Cy1, Cz1, and Cz2 were assumed to be the same among the samples. As presented in FIG. 15B, the simulation was conducted while the shapes of the wiring layers 14 and 24 were changed.

Other simulation conditions are as follows.

Element substrate 20: 42° rotated Y-cut X-propagation lithium tantalate substrate Linear thermal expansion coefficient: 16.1 ppm/° C. in the X direction, 9.5 ppm/° C. in the Y direction Mounting substrate 10: Alumina substrate with a linear thermal expansion coefficient of 7.1 ppm/° C.

Wiring layers 14 and 24: Gold layer

Simulated was the magnitude of the stress in the Z direction in the bonded part when the temperature is increased from a room temperature to 150° C.

Figures 16A, 16B:
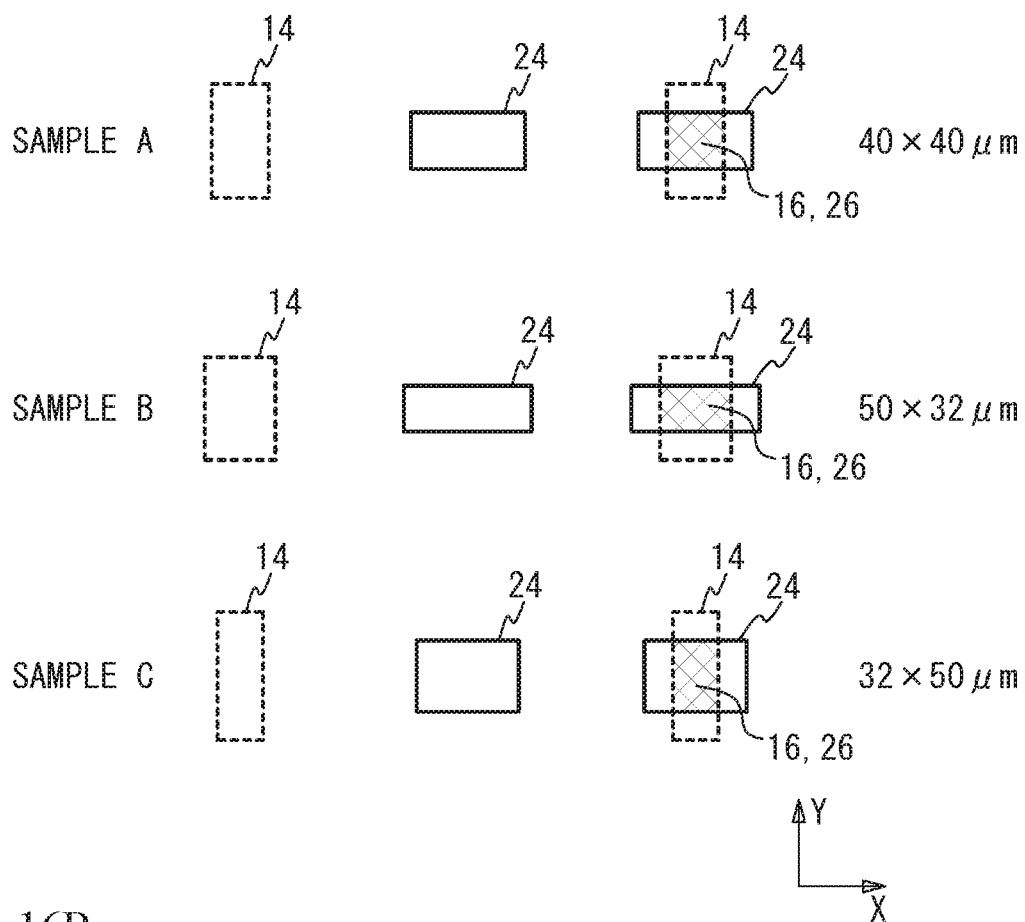
FIG. 16A illustrates planar shapes of wiring layers of samples A through C.
FIG. 16B presents stresses of the samples A through C.

FIG. 16A illustrates the planar shapes of the wiring layers of samples A through C, and FIG. 16B presents the stresses of the samples A through C. As illustrated in FIG. 16A, in the samples A through C, the wiring layer 14 has longer sides in the Y direction, and the wiring layer 24 has longer sides in the X direction. The shape of the bond region of the wiring layers 14 and 24 is a square of 40×40 μm in the sample A, a rectangle of 50×32 μm having longer sides in the X direction in the sample B, and a rectangle of 32×50 μm having longer sides in the Y direction in the sample C.

In FIG. 16B, the "bond region" indicates the maximum value of the magnitude of the stress in the Z direction in the bond surface between the wiring layers 14 and 24. The "element substrate 20" indicates the maximum value of the magnitude of the stress in the Z direction at the boundary face between the element substrate 20 and the wiring layer 24. The "mounting substrate 10" indicates the maximum value of the magnitude of the stress in the Z direction at the boundary face between the mounting substrate 10 and the wiring layer 14. The magnitude of the stress is normalized by defining the magnitude of the stress in the bond region of the sample A as 1. As presented in FIG. 16B, the magnitudes of the stresses of the element substrate 20 and the mounting substrate 10 are approximately a half of that in the bond region. The magnitude of the stress in the bond region is the least in the sample B.

Figures 17A, 17B:
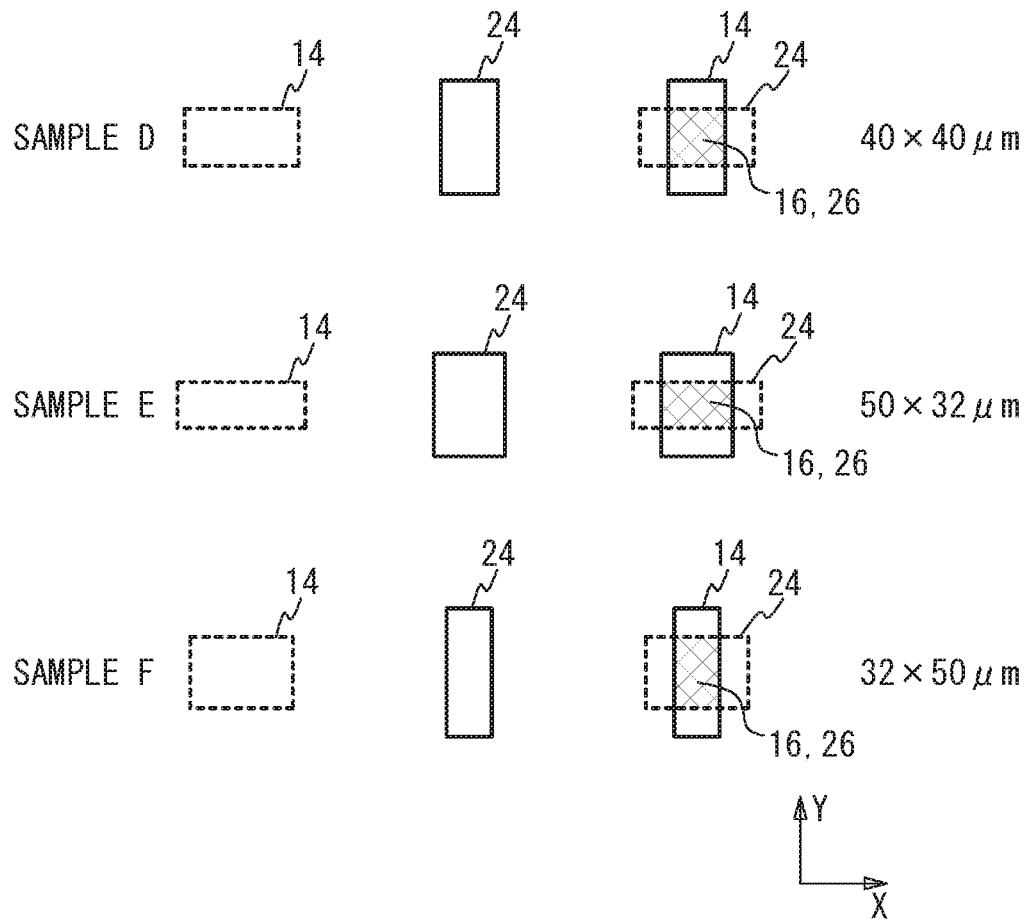
FIG. 17A illustrates planar shapes of wiring layers of samples D through F.
FIG. 17B presents stresses of the samples D through F.

FIG. 17A illustrates the planar shapes of the wiring layers of samples D through F, and FIG. 17B presents the stresses of the samples D through F. As illustrated in FIG. 17A, in the samples D through F, the wiring layer 14 has longer sides in the X direction, and the wiring layer 24 has longer sides in the Y direction. The shape of the bond region between the wiring layers 14 and 24 is a square of 40×40 μm in the sample D, a rectangle of 50×32 μm having longer sides in the X direction in the sample E, and a rectangle of 32×50 μm having longer sides in the Y direction in the sample F.

In FIG. 17B, the magnitude of the stress is normalized by defining the magnitude of the stress of the bond region in the sample A as 1. As presented in FIG. 17B, the magnitudes of the stresses of the element substrate 20 and the mounting substrate 10 are approximately a half of that of the bond region. The magnitude of the stress in the bond region is the least in the sample E.

As illustrated in FIG. 16A through FIG. 17B, regardless of the shapes of the wiring layer 14 and the wiring layer 24, when the shape of the bond region is a rectangle having longer sides in the X direction, the stress is the least. This is considered because the difference in linear thermal expansion coefficient between the element substrate 20 and the mounting substrate 10 is the greatest in the X direction.

As described above, the shapes of the bond regions 16 and 26 are preferably substantially a rectangle having longer sides in a direction in which the difference in linear thermal expansion coefficient between the element substrate 20 and the mounting substrate 10 is the greatest. This structure lessens the stress applied to the bond region.

When the element substrate 20 is a rotated Y-cut X-propagation lithium tantalate substrate or a rotated Y-cut X-propagation lithium niobate substrate, the shapes of the bond regions 16 and 26 are preferably substantially a rectangle having longer sides in the X-axis orientation of the crystal orientation of the element substrate 20. This configuration lessens the stress applied to the bond region.

The first through third embodiments describe an exemplary acoustic wave device having a sealing member located on the mounting substrate 10 and surrounding the element substrate 20, but the sealing member 30 may not be necessarily provided, and it is only required that the mounting substrate 10 and the element substrate 20 are bonded through the wiring layers 14 and 24.

A plurality of the element substrates 20 may be mounted on the mounting substrate 10. For example, the element substrate 20 including the transmit filter of a duplexer located thereon and the element substrate 20 including the receive filter located thereon may be mounted on the mounting substrate 10.

Although the embodiments of the present invention have been described in detail, it is to be understood that the various change, substitutions, and alterations could be made hereto without departing from the spirit and scope of the invention.

What is claimed is:

1. An acoustic wave device comprising:
   a mounting substrate;
   a first wiring layer located on an upper surface of the mounting substrate, the first wiring layer including a first bond region and a first connection region, the first connection region connecting with the first bond region and having a thickness substantially equal to a thickness of the first bond region;
   an element substrate mounted on the mounting substrate;
   an acoustic wave element located on a lower surface of the element substrate; and
   a second wiring layer located on the lower surface of the element substrate, the second wiring layer including a second bond region and a second connection region, the second bond region directly bonding with the first bond region of the first wiring layer, the second connection region connecting the acoustic wave element with the second bond region and having a thickness substantially equal to a thickness of the second bond region,
   wherein an extension direction of the first wiring layer intersects with an extension direction of the second wiring layer in a region where the first bond region is in contact with the second bond region.

2. The acoustic wave device according to claim 1, wherein
   a shape of the first bond region and a shape of the second bond region are rectangles having longer sides in a direction in which a difference in linear thermal expansion coefficient between the element substrate and the mounting substrate is greatest.

3. The acoustic wave device according to claim 1, wherein
   the element substrate is a rotated Y-cut X-propagation lithium tantalate substrate or a rotated Y-cut X-propagation lithium niobate substrate, and
   a shape of the first bond region and a shape of the second bond region are rectangles having longer sides in an X-axis orientation of a crystal orientation of the element substrate.

4. The acoustic wave device according to claim 1, wherein
   the acoustic wave element includes electrode fingers and a bus bar to which the electrode fingers are connected, and
   the second bond region overlaps with the bus bar in plan view.

5. The acoustic wave device according to claim 1, wherein
   the first bond region is provided in a plurality,
   the first connection region connects the plurality of the first bond regions,
   the acoustic wave element is provided in a plurality, and
   the second connection region connects the plurality of the acoustic wave elements.

6. The acoustic wave device according to claim 1, wherein
   the first bond region and the second bond region are bonded at a plurality of locations, and
   an area of a bond between the first bond region and the second bond region is approximately equal among the plurality of locations.

7. The acoustic wave device according to claim 1, further comprising:
   a third wiring layer located on the lower surface of the element substrate, the third wiring layer connecting a plurality of the acoustic wave elements and not being in contact with the first wiring layer in a region where the third wiring layer overlaps with the first wiring layer in plan view.

8. The acoustic wave device according to claim 1, wherein
   a part of the first wiring layer being in contact with a boundary face between the first bond region and the second bond region and a part of the second wiring layer being in contact with the boundary face between the first bond region and the second bond region are mainly composed of copper or gold.

9. A method of making an acoustic wave device, comprising:
   forming a mounting substrate;
   forming a first wiring layer located on an upper surface of the mounting substrate, the first wiring layer including a first bond region and a first connection region, the first connection region connecting with the first bond region and having a thickness substantially equal to a thickness of the first bond region;
   forming an element substrate mounted on the mounting substrate;
   forming an acoustic wave element located on a lower surface of the element substrate; and
   forming a second wiring layer located on the lower surface of the element substrate, the second wiring layer including a second bond region and a second connection region, the second bond region directly bonding with the first bond region of the first wiring layer, the second connection region connecting the acoustic wave element with the second bond region and having a thickness substantially equal to a thickness of the second bond region,
   wherein an extension direction of the first wiring layer intersects with an extension direction of the second wiring layer in a region where the first bond region is in contact with the second bond region.

10. An acoustic wave device comprising:
    a mounting substrate;
    a first wiring layer located on an upper surface of the mounting substrate, the first wiring layer including a first bond region and a first connection region, the first connection region connecting with the first bond region and having a thickness substantially equal to a thickness of the first bond region;
    an element substrate mounted on the mounting substrate;
    an acoustic wave element located on a lower surface of the element substrate; and
    a second wiring layer located on the lower surface of the element substrate, the second wiring layer including a second bond region and a second connection region, the second bond region directly bonding with the first bond region of the first wiring layer, the second connection region connecting the acoustic wave element with the second bond region and having a thickness substantially equal to a thickness of the second bond region, wherein a shape of the first bond region and a shape of the second bond region are rectangles having longer sides in a direction in which a difference in linear thermal expansion coefficient between the element substrate and the mounting substrate is greatest.

\* \* \* \* \*